(12) United States Patent
Liao et al.

(10) Patent No.: US 12,313,925 B2
(45) Date of Patent: May 27, 2025

(54) MICRO LED TRANSPARENT DISPLAY

(71) Applicant: PlayNitride Display Co., Ltd., Miaoli County (TW)

(72) Inventors: Kuan-Yung Liao, Miaoli County (TW); Yun-Li Li, Miaoli County (TW)

(73) Assignee: PlayNitride Display Co., Ltd., Miaoli County (TW)

( * ) Notice: Subject to any disclaimer, the term of this patent is extended or adjusted under 35 U.S.C. 154(b) by 441 days.

(21) Appl. No.: 18/058,768

(22) Filed: Nov. 24, 2022

(65) Prior Publication Data

US 2023/0102042 A1    Mar. 30, 2023

Related U.S. Application Data

(63) Continuation-in-part of application No. 17/135,949, filed on Dec. 28, 2020, now Pat. No. 11,538,853.

(30) Foreign Application Priority Data

Nov. 20, 2020   (TW) ................................. 109140887

(51) Int. Cl.
*G02F 1/1333* (2006.01)
*G02F 1/13357* (2006.01)
(Continued)

(52) U.S. Cl.
CPC .. *G02F 1/133342* (2021.01); *G02F 1/133302* (2021.01); *G02F 1/133603* (2013.01);
(Continued)

(58) Field of Classification Search
CPC ......... G02F 1/133342; G02F 1/133302; G02F 1/133603; G02F 1/155; G02F 1/157;
(Continued)

(56) References Cited

U.S. PATENT DOCUMENTS

2019/0325803 A1\* 10/2019 Chen ...................... H01L 25/167
2020/0058625 A1\* 2/2020 Chen ................... H01L 25/0753
(Continued)

FOREIGN PATENT DOCUMENTS

CN          1580885 A      2/2005
CN          1690785 A     11/2005
(Continued)

*Primary Examiner* — Victor A Mandala
(74) *Attorney, Agent, or Firm* — CKC & Partners Co., LLC

(57) ABSTRACT

A micro LED transparent display has a first display surface and a second display surface, which are opposite to each other. The micro LED transparent display includes a substrate, pixels and at least one grating layer. The first display surface and the second display surface are located on two opposite sides of the substrate, respectively. The pixels are arranged in arrays on the substrate, each of the pixels includes micro LEDs, and the micro LEDs are electrically connected to the substrate. The grating layer is disposed on the substrate, and the micro LEDs are located between the grating layer and the substrate. Lights generated from the micro LEDs of the pixels can be controlled by the grating layer, and the lights partially penetrate through the first display surface and are partially reflected and penetrate through the second display surface.

18 Claims, 13 Drawing Sheets

(51) Int. Cl.
*G02F 1/155* (2006.01)
*G02F 1/157* (2006.01)
*H10H 20/833* (2025.01)
*H10H 20/857* (2025.01)
*H10H 29/14* (2025.01)

(52) U.S. Cl.
CPC .............. *G02F 1/155* (2013.01); *G02F 1/157* (2013.01); *H10H 20/833* (2025.01); *H10H 20/857* (2025.01); *H10H 29/142* (2025.01); *G02F 2201/44* (2013.01)

(58) Field of Classification Search
CPC .................. G02F 2201/44; H10H 20/833; H10H 20/857; H10H 29/142; H10H 20/855; H10H 20/853; H10H 20/856; H01L 25/0753
See application file for complete search history.

(56) References Cited

U.S. PATENT DOCUMENTS

| | | | | |
|---|---|---|---|---|
| 2021/0242248 | A1* | 8/2021 | Chen | H01L 25/0753 |
| 2021/0327340 | A1* | 10/2021 | Fan | G09G 3/32 |
| 2022/0102324 | A1* | 3/2022 | Brick | H10H 20/8514 |
| 2022/0244555 | A1* | 8/2022 | Dobner | B32B 27/36 |

FOREIGN PATENT DOCUMENTS

| | | |
|---|---|---|
| CN | 103309114 A | 9/2013 |
| CN | 108231849 A | 6/2018 |
| CN | 109031763 A | 12/2018 |
| CN | 110850621 A | 2/2020 |
| JP | 2002333615 A | 11/2002 |
| JP | 2006276111 A | 10/2006 |
| JP | 2015210298 A | 11/2015 |
| WO | 02052338 A1 | 7/2002 |
| WO | 2014190719 A1 | 12/2014 |

* cited by examiner

MICRO LED TRANSPARENT DISPLAY

RELATED APPLICATIONS

This application is a Continuation-in-part of U.S. application Ser. No. 17/135,949, filed on Dec. 28, 2020, which claims priority of Taiwan Application Serial Number 109140887, filed Nov. 20, 2020, the entirety of which is incorporated by reference herein.

BACKGROUND

Technical Field

The present disclosure relates to a transparent display. More particularly, the present disclosure relates to a micro LED transparent display.

Description of Related Art

According to the developing trend of the displays on the market, not only are single-side displays promoted, but dual-side displays are simultaneously developed. In general, a user can both observe the same images or the different images from two sides of the dual-side display via the dual-side displays.

However, the effect of the dual-side display of the dual-side display on the market is often obtained by disposing two display screens on two opposite sides of the dual-side display, respectively. Hence, the thickness of the dual-side display on the market may be too thick, and the transparency of the dual-side display on the market is worse.

SUMMARY

According to one aspect of the present disclosure, a micro LED transparent display has a first display surface and a second display surface, which are opposite to each other. The micro LED transparent display includes a substrate, a plurality of pixels and at least one grating layer. The first display surface and the second display surface are located on two opposite sides of the substrate, respectively. The pixels are arranged in arrays on the substrate, each of the pixels includes a plurality of micro LEDs, and the micro LEDs are electrically connected to the substrate. The grating layer is disposed on the substrate, and the micro LEDs are located between the grating layer and the substrate. Lights generated from the micro LEDs of the pixels can be controlled by the grating layer, and the lights partially penetrate through the first display surface and are partially reflected and penetrate through the second display surface.

According to one aspect of the present disclosure, a micro LED transparent display has a first display surface and a second display surface, which are opposite to each other. The micro LED transparent display includes a substrate, a plurality of pixels, and a micro lens layer. The substrate is located between the first display surface and the second display surface. The pixels are arranged in arrays on the substrate. Each of the pixels includes a plurality of micro LEDs. The micro LEDs are electrically connected to the substrate. The micro lens layer is located at one side of the pixels. Lights generated from the micro LEDs of a first group of the pixels form a first image on a first imaging plane after propagating via the micro lens layer. Lights generated from the micro LEDs of a second group of the pixels partially penetrate through the first display surface and partially penetrate through the second display surface and form a second image on a second imaging plane.

DETAILED DESCRIPTION

Figure 1:
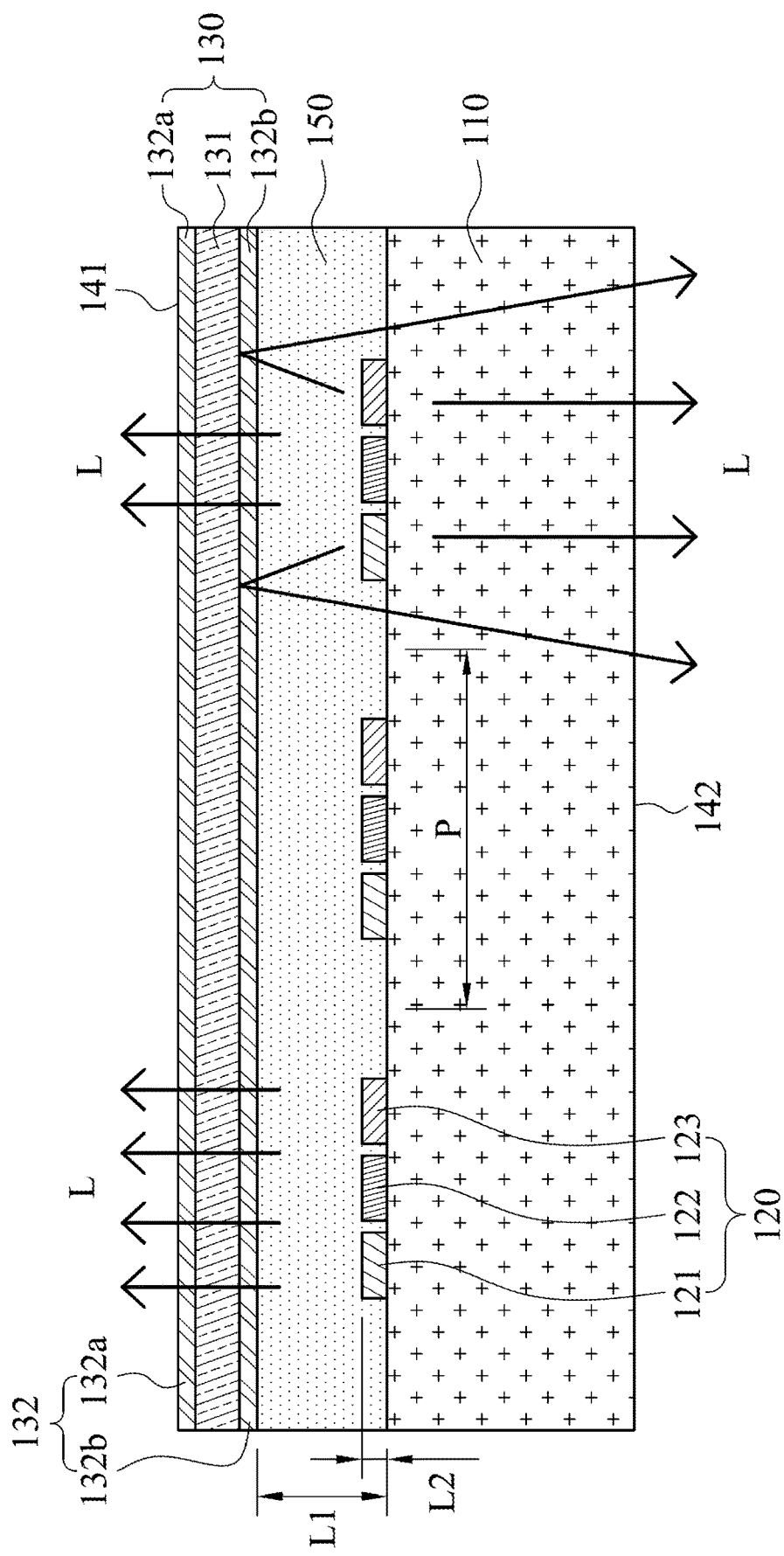
FIG. 1 is a schematic view of a micro LED transparent display according to an embodiment of the present disclosure.
Figure 2A:
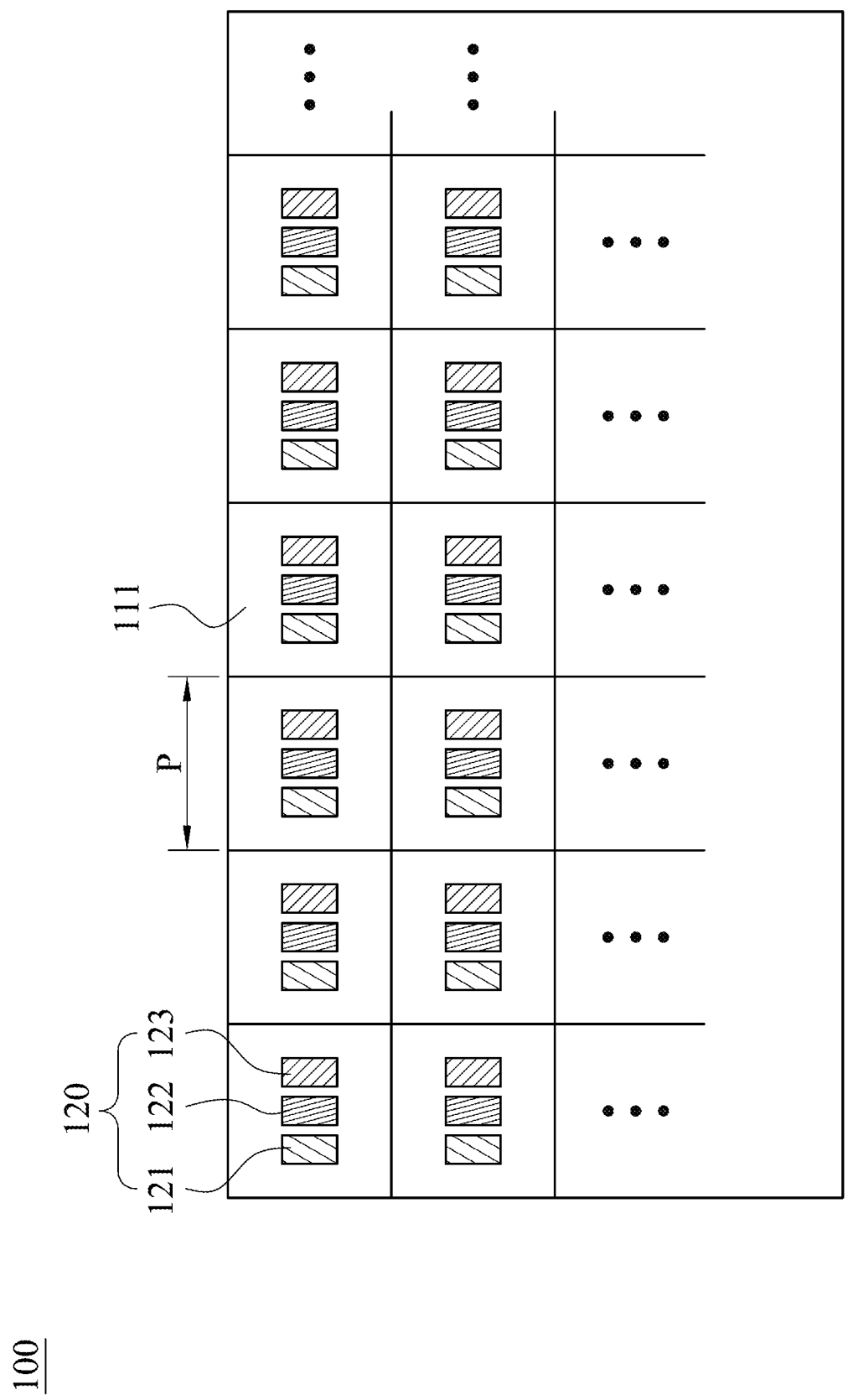
FIG. 2A is a disposing schematic view of the micro LED transparent display according to the embodiment in FIG. 1.

FIG. 1 is a schematic view of a micro LED transparent display 100 according to an embodiment of the present disclosure. FIG. 2A is a disposing schematic view of the micro LED transparent display 100 according to the embodiment in FIG. 1. In FIGS. 1 and 2A, the micro LED transparent display 100 has a first display surface 141 and a second display surface 142, which are opposite to each other. The micro LED transparent display 100 includes a substrate 110, a plurality of pixels 111, a flat layer 150 and at least one grating layer 130, wherein the first display surface 141 and the second display surface 142 are located on two opposite sides of the substrate 110, respectively.

Each of the pixels 111 is arranged in arrays on the substrate 110, at least one micro unit 120 is disposed on each of the pixels 111 as a self-luminous light source, and each of the pixels 111 includes a plurality of micro LEDs. In detail, each of the micro units 120 includes the micro LEDs, and the micro LEDs are electrically bonded to and connected to the substrate 110. According to the embodiment of FIG. 1, a number of the micro LEDs of each of the pixels 111 is three, and each of the micro units 120 includes the three micro LEDs 121, 122, 123. The micro LEDs 121, 122, 123 are separated into a red micro LED, a green micro LED and a blue micro LED, respectively, that is, the micro LEDs 121, 122, 123 emit a red light, a green light and a blue light, respectively, and the sequence thereof is not limited to the embodiment of FIG. 1. According to the embodiment of FIG. 1, each of the micro LEDs 121, 122, 123 is a thin film structure which a thickness thereof is thinner than 10 micrometers and a width thereof is smaller than 100 micrometers. Further, the thickness of each of the micro LEDs 121, 122, 123 can arrange from 5 micrometers to 10 micrometers, and the width of each of the micro LEDs 121, 122, 123 can be smaller than 30 micrometers. Moreover, the width of each of the micro LEDs 121, 122, 123 can be 10 micrometers to 30 micrometers, but the present disclosure is not limited thereto.

The grating layer 130 is disposed on the substrate 110, and the micro LEDs 121, 122, 123 are located between the grating layer 130 and the substrate 110, wherein the grating layer 130 can be a dyed liquid crystal layer, an electrophoresis layer, an electrochromic layer or a reflective polarizer film. According to the embodiment of FIG. 1, the grating layer 130 includes a dyed liquid crystal layer 131 and an electrode structure 132, wherein the dyed liquid crystal layer 131 is interposed between the electrode structure 132. The dyed liquid crystal layer 131 can be a nematic liquid crystal doped with a highly reflective dye, and the reflectance of the dyed liquid crystal layer 131 is controlled by an optical axis rotation of the nematic liquid crystal. In other words, the reflectance of the dyed liquid crystal layer 131 can be controlled by the electrode structure 132, but the present disclosure is not limited thereto. It should be mentioned that the grating layer can be composed of the electrophoresis layer and the electrode structure, and the reflectance can be changed by controlling the aggregation of the particles in the electrophoresis layer, that is, the reflectance of both of the dyed liquid crystal layer and the electrophoresis layer can be controlled by the electrode structure, but the present disclosure is not limited thereto.

In particular, lights L generated from the micro LEDs 121, 122, 123 of the pixels 111 can be controlled by the grating layer 130, and the lights L partially penetrate through the first display surface 141 and are partially reflected and penetrate through the second display surface 142. Therefore, the control of the light direction (that is, a display image can be shown from a front side, a back side or both of the front side and the back side) can be obtained, and the size or the thickness of the micro LED transparent display 100 can be reduced.

The electrode structure 132 includes an upper electrode pattern 132a and a lower electrode pattern 132b, and the dyed liquid crystal layer 131 is located between the upper electrode pattern 132a and the lower electrode pattern 132b. The rotation of the dyed liquid crystal in the dyed liquid crystal layer 131 is controlled by an electric field generated from the upper electrode pattern 132a and the lower electrode pattern 132b for adjusting a degree of a light penetration and a light reflection from the micro units 120. Therefore, a dual-side display or a single-side display of the micro LED transparent display 100 can be set up on demand, and a displaying luminance of the dual-side display of the micro LED transparent display 100 can be suitably adjusted. Further, the electrode structure 132 is a transparent conductive layer, and the upper electrode pattern 132a and the lower electrode pattern 132b can be an entire film, or the upper electrode pattern 132a and the lower electrode pattern 132b can be patterned according to the locations of the pixels 111.

The flat layer 150 is located between the substrate 110 and the grating layer 130 and covers the micro LEDs 121, 122, 123, and the flat layer 150 is an optical adhesive layer, wherein the optical adhesive layer has a high light transmittance (>80%), and the optical adhesive layer can be made of a polypropylene, but the present disclosure is not limited thereto. Furthermore, when a height of the flat layer 150 is L1, and a height of each of the micro LEDs 121, 122, 123 is L2, the following condition can be satisfied: $10 \geq L1/L2 > 5$. If $L1/L2 < 5$, a surface flatness of the flat layer 150 covering the micro units 120 is getting worse; if $L1/L2 > 10$, a yield rate of the subsequent processes and a light-emitting efficiency will be influenced. Therefore, the height L1 of the flat layer 150 should be larger than the height L2 of each of the micro LEDs 121, 122, 123, and a better ratio of L1/L2 arranges from 5 to 10.

Furthermore, when a spacing between every adjacent two of the pixels is P, the following condition is satisfied: P 100 micrometers. Therefore, the penetration and the reflection of the lights L generated from the micro LEDs 121, 122, 123 can be avoided being influenced, and both of the transparency and the luminance of the micro LED transparent display 100 can be maintained so as to obtain the better display quality.

Figure 2B:
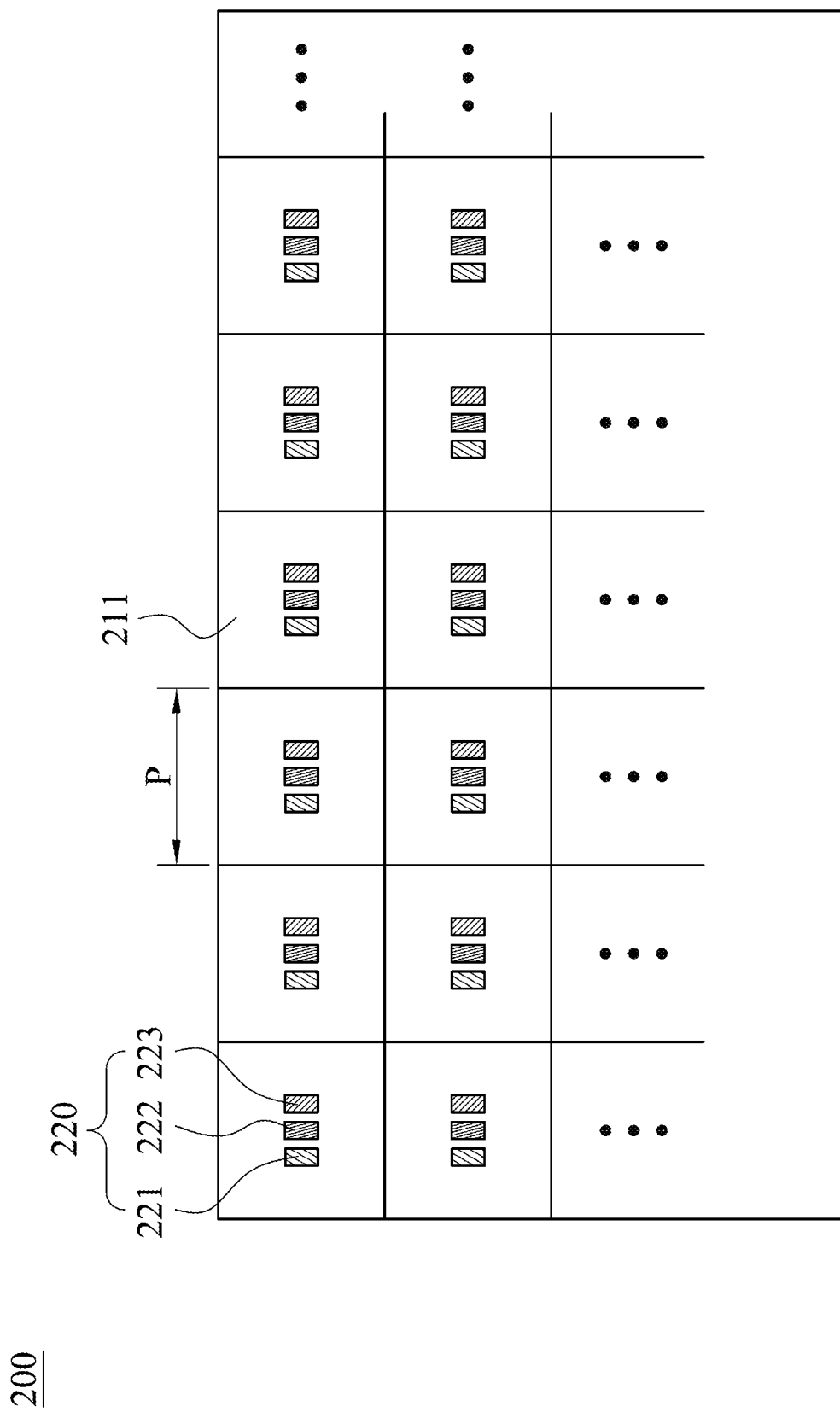
FIG. 2B is a disposing schematic view of the micro LED transparent display according to another embodiment of the present disclosure.

FIG. 2B is a disposing schematic view of the micro LED transparent display 200 according to another embodiment of the present disclosure. In FIGS. 2A and 2B, a micro LED transparent display 200 according to the embodiment of FIG. 2B is similar to the micro LED transparent display 100 according to the embodiment of FIG. 2A, an area ratio of micro units 220 of each of pixels 211 of the micro LED transparent display 200 according to the embodiment of FIG. 2B is different from an area ratio of the micro units 120 of each of the pixels 111 of the micro LED transparent display 100 according to the embodiment of FIG. 2A, and the area ratio of the micro units 220 of each of the pixels 211 of the micro LED transparent display 200 according to the embodiment of FIG. 2B is 10% to 25%. In detail, a total of a projecting area of three micro LEDs 221, 222, 223 of each of the pixels 211 on a substrate (not shown) is 10% to 25% of an area of the pixels 211. That is, the area of the pixels 211 is equal to a square of a spacing between every adjacent two of the pixels 211, and a range of the total projecting area of the three micro LEDs 221, 222, 223 on the substrate is $0.1 P^2$ to $0.25 P^2$. Therefore, the transparency of the micro LED transparent display 200 can be promoted, and the transparency of the micro LED transparent display 200 can be obtained at least 60% if the micro LED transparent display 200 cooperated with the disposition of P 100 micrometers.

Further, all of other structures and dispositions according to the embodiment of FIG. 2B are the same as the structures and the dispositions according to the embodiments of FIG. 2A, and will not be described again herein.

Figure 3:
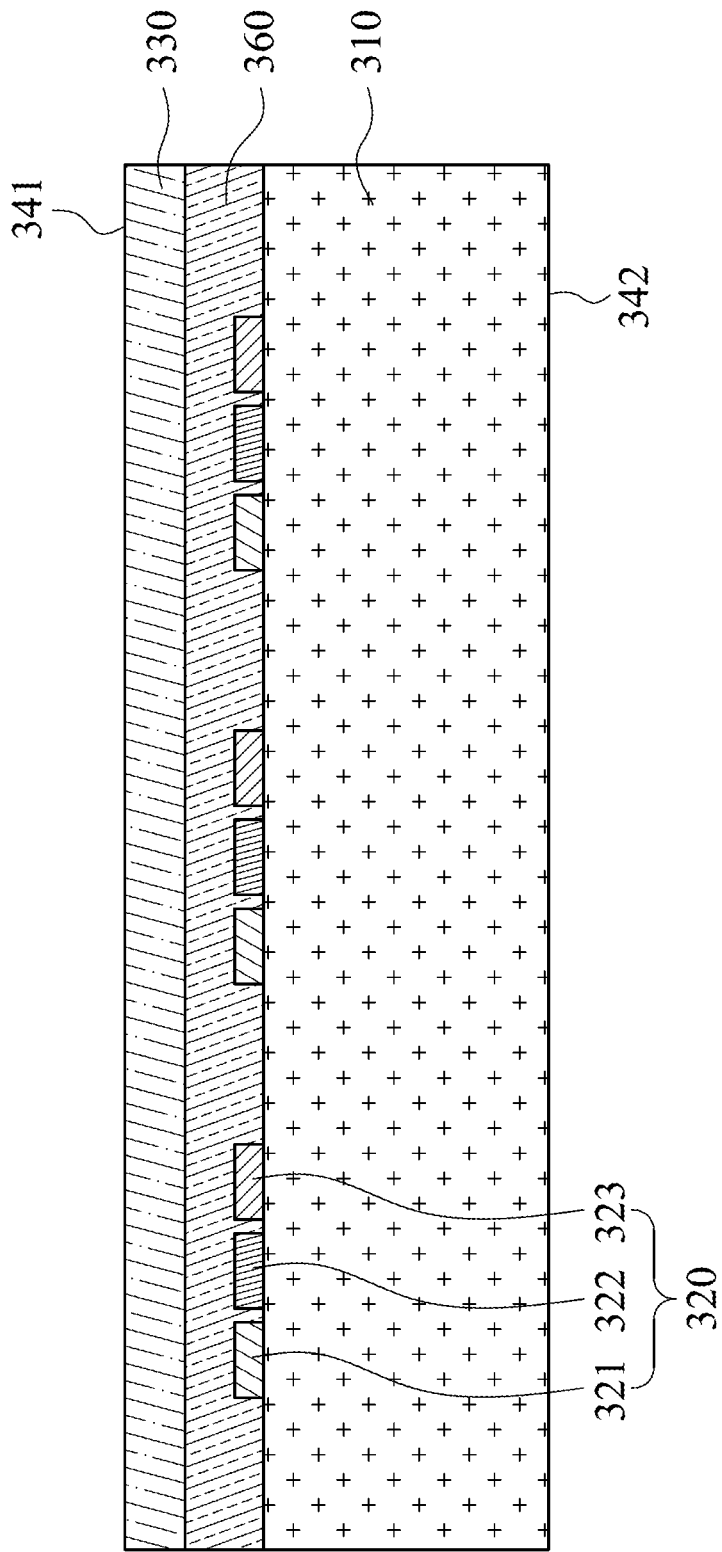
FIG. 3 is a schematic view of a micro LED transparent display according to another embodiment of the present disclosure.

FIG. 3 is a schematic view of a micro LED transparent display 300 according to another embodiment of the present disclosure. In FIG. 3, the micro LED transparent display 300 has a first display surface 341 and a second display surface 342, which are opposite to each other. The micro LED transparent display 300 includes a substrate 310, a plurality of pixels (its reference numeral is omitted), a liquid crystal layer 360 and a grating layer 330, wherein the first display surface 341 and the second display surface 342 are located on two opposite sides of the substrate 310, respectively.

Each of the pixels is arranged in arrays on the substrate 310, at least one micro unit 320 is disposed on each of the pixels as a self-luminous light source, and each of the pixels includes a plurality of micro LEDs. In detail, each of the micro units 320 includes the micro LEDs, and the micro LEDs are electrically bonded to and connected to the substrate 310. According to the embodiment of FIG. 3, a number of the micro LEDs of each of the pixels is three, and each of the micro units 320 includes the three micro LEDs 321, 322, 323. The micro LEDs 321, 322, 323 are separated into a red micro LED, a green micro LED and a blue micro LED, respectively, that is, the micro LEDs 321, 322, 323 emit a red light, a green light and a blue light, respectively, and the sequence thereof is not limited to the embodiment of FIG. 3.

According to the embodiment of FIG. 3, the grating layer 330 is disposed on the micro units 320, and the grating layer 330 is a reflective polarizer film. The reflective polarizer film is configured to cooperate with the liquid crystal layer 360, and a specific polarized light can be reflected via the reflective polarizer film. In detail, the substrate 310 has a liquid crystal control-electrode layer (not shown) and a micro LED control-electrode layer (not shown), wherein a liquid crystal of the liquid crystal layer 360 can be controlled by the liquid crystal control-electrode layer, and the luminance of the micro LEDs 321, 322, 323 is bonded to and controlled by the micro LED control-electrode layer.

In particular, lights (its reference numeral is omitted) generated from the micro LEDs 321, 322, 323 of the pixels can be controlled by the grating layer 330, and the lights partially penetrate through the first display surface 341 and are partially reflected and penetrate through the second display surface 342. Therefore, the control of the light direction (that is, a display image can be shown from a front side, a back side or both of the front side and the back side) can be obtained, and the size or the thickness of the micro LED transparent display 300 can be reduced.

The liquid crystal is rotated by controlling the electric field via the liquid crystal control-electrode layer so as to decide a polarization degree of the lights of the micro units 320 and adjust the reflectance via the grating layer 330. Therefore, a dual-side display or a single-side display of the micro LED transparent display 300 can be set up on demand, and a displaying luminance of the dual-side display of the micro LED transparent display 300 can be suitably adjusted.

It should be mentioned that the liquid crystal control-electrode layer can be also disposed on two sides of the liquid crystal layer 360, that is, the liquid crystal control-electrode layer is located on the substrate 310 and the surface of the grating layer 330 facing the liquid crystal layer 360.

The liquid crystal layer 360 is located between the substrate 310 and the grating layer 330 and covers the micro units 320. A plurality of spacers (not shown) are also disposed on the substrate 310, and the spacers are configured to control and maintain a thickness of the liquid crystal layer 360. The aforementioned disposition is the common knowledge of a general LCD, and other details of the general LCD will not be described herein. In particular, the liquid crystal layer 360 is configured to change a refractivity of the lights and control a degree of the penetration of the specific polarized light and the reflection of the specific polarized light from the micro units 320. It is better that the thickness of the liquid crystal layer 360 is not larger than twice of a height of each of the micro LEDs 321, 322, 323, but larger than the height of the micro LEDs 321, 322, 323. When the thickness of the crystal liquid layer 360 is larger than twice of the height of each of the micro LEDs 321, 322, 323, the electric field must be strengthened so as to drive the liquid crystal rotating, and the light transmittance is also lowered; when the thickness of the liquid crystal layer 360 is smaller than the height of the micro LEDs 321, 322, 323, the micro LEDs 321, 322, 323 cannot be covered by the liquid crystal layer 360. Therefore, the display quality of the micro LED transparent display 300 gets better when the thickness of the liquid crystal layer 360 is larger than the height of the micro LEDs 321, 322, 323 and smaller than twice of the height of each of the micro LEDs 321, 322, 323.

Further, all of other structures and dispositions according to the embodiment of FIG. 3 are the same as the structures and the dispositions according to the embodiments of FIG. 1, and will not be described again herein.

Figure 4:
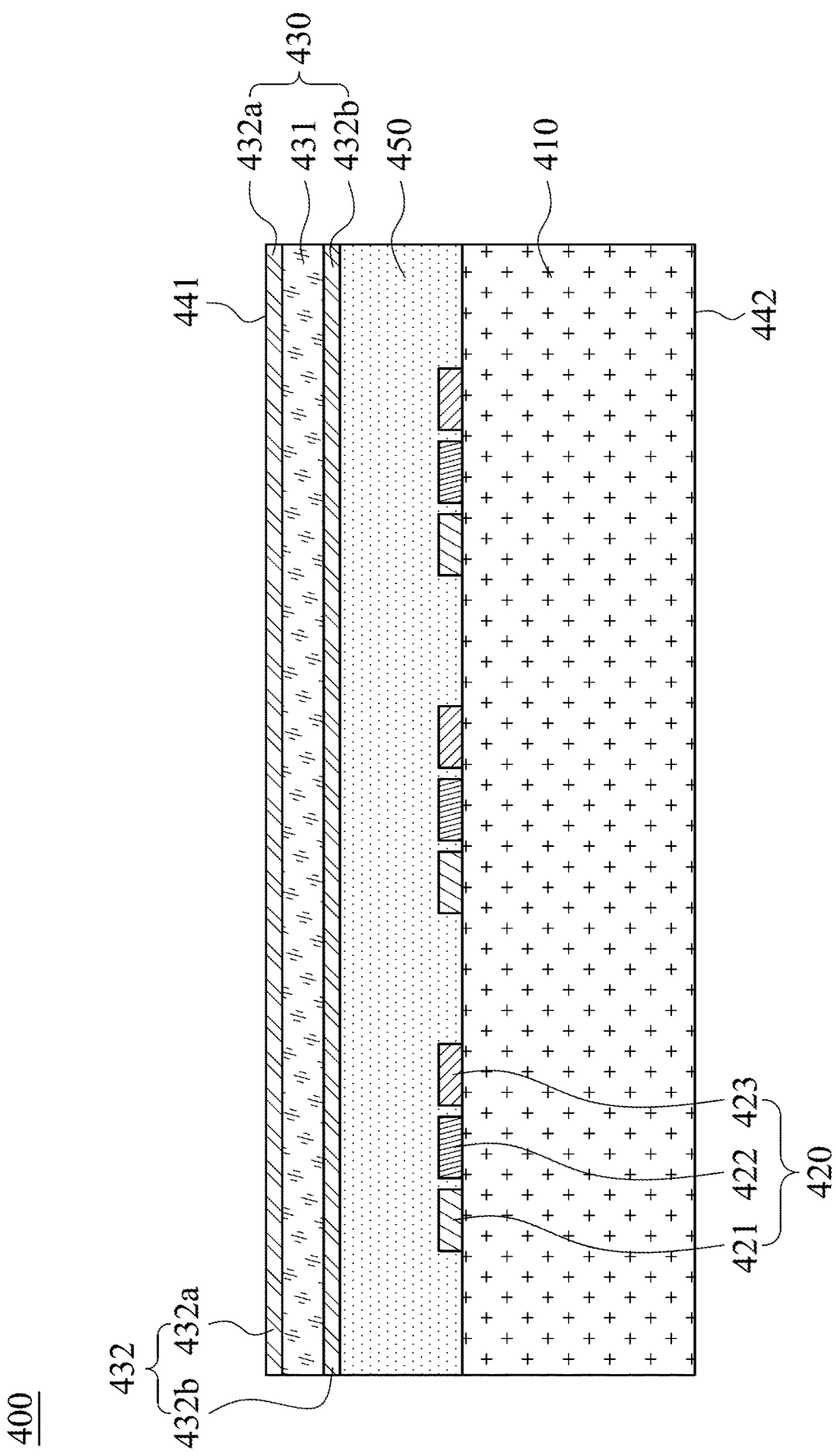
FIG. 4 is a schematic view of a micro LED transparent display according to still another embodiment of the present disclosure.

FIG. 4 is a schematic view of a micro LED transparent display 400 according to still another embodiment of the present disclosure. In FIG. 4, the micro LED transparent display 400 has a first display surface 441 and a second display surface 442, which are opposite to each other. The micro LED transparent display 400 includes a substrate 410, a plurality of pixels (its reference numeral is omitted), a flat layer 450 and at least one grating layer 430, wherein the first display surface 441 and the second display surface 442 are located on two opposite sides of the substrate 410, respectively.

Each of the pixels is arranged in arrays on the substrate 410, at least one micro unit 420 is disposed on each of the pixels as a self-luminous light source, and each of the pixels includes a plurality of micro LEDs. In detail, each of the micro units 420 includes the micro LEDs, and the micro LEDs are electrically bonded to and connected to the substrate 410. According to the embodiment of FIG. 4, a number of the micro LEDs 421, 422, 423 of each of the pixels is three, and each of the micro units 420 includes the three micro LEDs 421, 422, 423. The micro LEDs 421, 422, 423 are separated into a red micro LED, a green micro LED and a blue micro LED, respectively, that is, the micro LEDs 421, 422, 423 emit a red light, a green light and a blue light, respectively, and the sequence thereof is not limited to the embodiment of FIG. 4.

The grating layer 430 is disposed on the micro units 420, and the micro LEDs 421, 422, 423 are located between the grating layer 430 and the substrate 410. According to the embodiment of FIG. 4, the grating layer 430 includes an electrochromic layer 431 and an electrode structure 432, wherein the electrochromic layer 431 is interposed between the electrode structure 432. Further, the electrochromic layer 431 can be made of a metal oxide, such as a titania, and the electrochromic layer 431 is configured to control a light reflectance of the micro LEDs 421, 422, 423. Lights (its reference numeral is omitted) generated from the micro LEDs 421, 422, 423 of the pixels can be controlled by the grating layer 430, and the lights partially penetrate through the first display surface 441 and are partially reflected and penetrate through the second display surface 442. Therefore, the control of the light direction (that is, a display image can be shown from a front side, a back side or both of the front side and the back side) can be obtained, and the size or the thickness of the micro LED transparent display 400 can be reduced.

The electrode structure 432 includes an upper electrode pattern 432a and a lower electrode pattern 432b, and the electrochromic layer 431 is located between the upper electrode pattern 432a and the lower electrode pattern 432b. The electrochromic layer 431 is controlled by an electric field generated from the upper electrode pattern 432a and the lower electrode pattern 432b for adjusting a degree of a light penetration and a light reflection from the micro units 420. Therefore, a dual-side display or a single-side display of the micro LED transparent display 400 can be set up on demand, and a displaying luminance of the dual-side display of the micro LED transparent display 400 can be suitably adjusted. Further, the electrode structure 432 is a transparent conductive layer, and the upper electrode pattern 432a and the lower electrode pattern 432b can be an entire film, or the upper electrode pattern 432a and the lower electrode pattern 432b can be patterned according to the locations of the pixels.

The flat layer 450 is located between the substrate 410 and the grating layer 430 and covers the micro LEDs 421, 422, 423, and the flat layer 450 is an optical adhesive layer, wherein the optical adhesive layer has the light transmittance, and the optical adhesive layer can be made of a polypropylene, but the present disclosure is not limited thereto.

Further, all of other structures and dispositions according to the embodiment of FIG. 4 are the same as the structures and the dispositions according to the embodiments of FIG. 1, and will not be described again herein.

Figure 5:
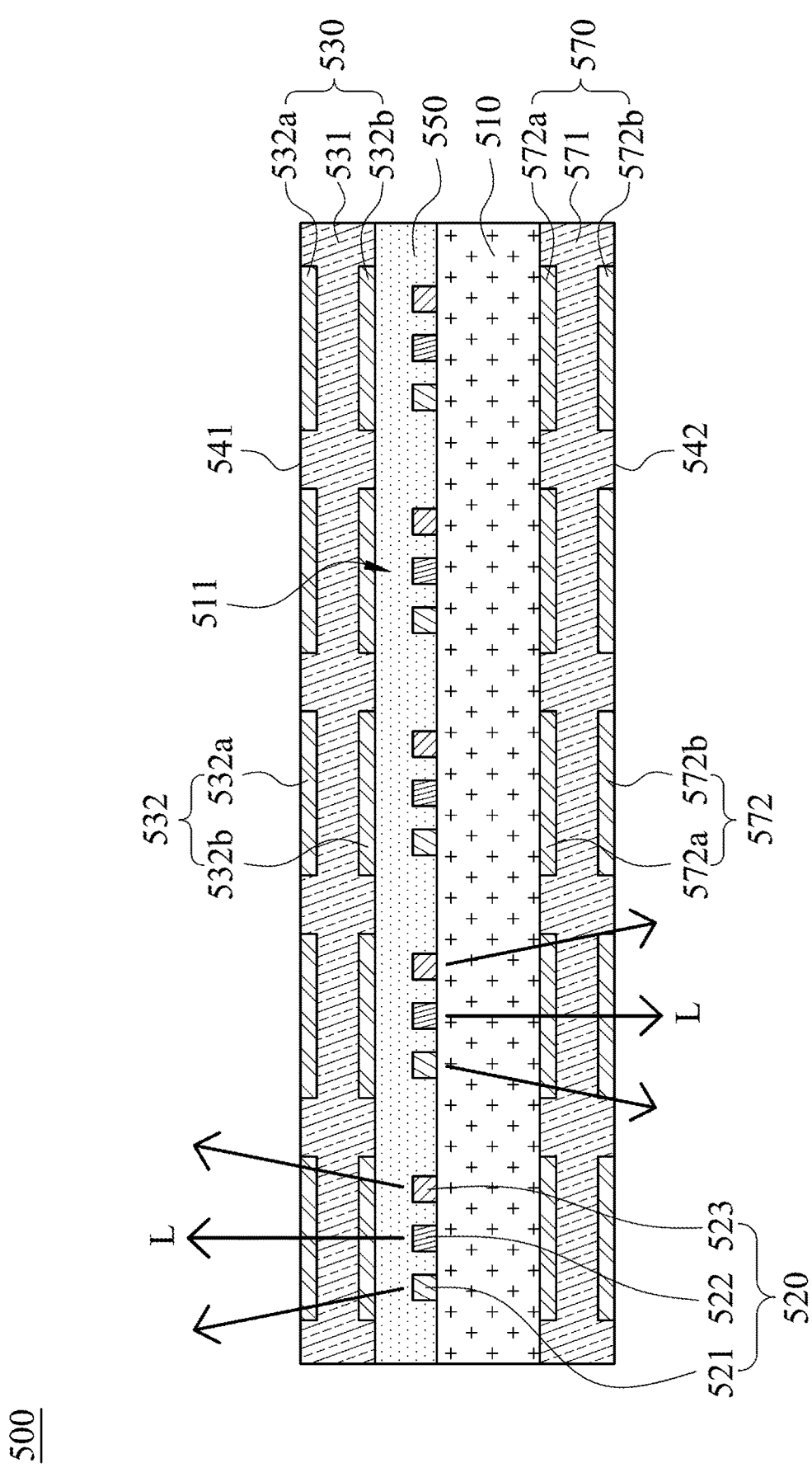
FIG. 5 is a schematic view of a micro LED transparent display according to another embodiment of the present disclosure.

FIG. 5 is a schematic view of a micro LED transparent display 500 according to another embodiment of the present disclosure. In FIG. 5, the micro LED transparent display 500 has a first display surface 541 and a second display surface 542, which are opposite to each other. The micro LED transparent display 500 includes a substrate 510, a plurality of pixels 511, a flat layer 550, a first grating layer 530 and a second grating layer 570, wherein the first display surface 541 and the second display surface 542 are located on two opposite sides of the substrate 510, respectively.

Each of the pixels 511 is arranged in arrays on the substrate 510, at least one micro unit 520 is disposed on each of the pixels 511 as a self-luminous light source, and each of the pixels 511 includes a plurality of micro LEDs. In detail, each of the micro units 520 includes the micro LEDs, and the micro LEDs are electrically bonded to and connected to the substrate 510. According to the embodiment of FIG. 5, a number of the micro LEDs of each of the pixels 511 is three, and each of the micro units 520 includes the three micro LEDs 521, 522, 523. The micro LEDs 521, 522, 523 are separated into a red micro LED, a green micro LED and a blue micro LED, respectively, that is, the micro LEDs 521, 522, 523 emit a red light, a green light and a blue light, respectively, and the sequence thereof is not limited to the embodiment of FIG. 5.

One of main differences between the micro LED transparent display 500 according to the embodiment of FIG. 5 and the micro LED transparent display 100 according to the embodiment of FIG. 1 is a number of the grating layer, wherein the number of the grating layers according to the embodiment of FIG. 5 is two, and the grating layers according to the embodiment of FIG. 5 are the first grating layer 530 and the second grating layer 570. The first grating layer 530 and the second grating layer 570 are disposed on the two opposite sides of the substrate 510, respectively, and the micro LEDs 521, 522, 523 are located between the first grating layer 530 and the second grating layer 570. Furthermore, a material of the first grating layer 530 can be the same as a material of the second grating layer 570, for example, the material of the first grating layer 530 and the second grating layer 570 can be reflective dyed liquid crystal layers or absorption dyed liquid crystal layers. According to the embodiment of FIG. 5, both of the first grating layer 530 and the second grating layer 570 are the absorption dyed liquid crystal layers, but the present disclosure is not limited thereto.

According to the embodiment of FIG. 5, the first grating layer 530 includes a dyed liquid crystal layer 531 and an electrode structure 532, and the second grating layer 570 includes a dyed liquid crystal layer 571 and an electrode structure 572, wherein the dyed liquid crystal layer 531 is interposed between the electrode structure 532, and the dyed liquid crystal layer 571 is interposed between the electrode structure 572.

In detail, the electrode structure 532 of the first grating layer 530 is configured to control a transmittance of lights L generated from the micro LEDs 521, 522, 523 of the pixels 511. The electrode structure 532 is designed according to each pixel 511, so that the electrode structure 532 can adjust the lights L penetrate through the first display surface 541 by pixels 511 respectively. Likewise, the electrode structure 572 of the second grating layer 570 is configured to control the transmittance of the lights L generated from the micro LEDs 521, 522, 523 of the pixels 511. The electrode structure 572 is designed according to each pixel 511, so that the electrode structure 572 can adjust the lights L penetrate through the second display surface 542 by pixels 511 respectively.

The lights L do not be absorbed by the dyed liquid crystals between adjacent two of the pixels 511, and the transparency of the micro LED transparent display 500 is maintained. Furthermore, the electrode structure 532 includes an upper electrode pattern 532a and a lower electrode pattern 532b, and the dyed liquid crystal layer 531 is located between the upper electrode pattern 532a and the lower electrode pattern 532b; the electrode structure 572 includes an upper electrode pattern 572a and a lower electrode pattern 572b, and the dyed liquid crystal layer 571 is located between the upper electrode pattern 572a and the lower electrode pattern 572b. The dyed liquid crystals of the dyed liquid crystal layer 531 can be controlled by an electric field generated from the upper electrode pattern 532a and the lower electrode pattern 532b for adjusting the absorption of the lights L, and the dyed liquid crystals of the dyed liquid crystal layer 571 can be controlled by an electric field generated from the upper electrode pattern 572a and the lower electrode pattern 572b for adjusting the absorption of the lights L. According to the embodiment of FIG. 5, the locations of the electrode structures 532, 572 are arranged according to locations of the pixels 511.

The flat layer 550 is located between the substrate 510 and the first grating layer 530 and covers the micro LEDs 521, 522, 523, and the flat layer 550 is an optical adhesive layer, wherein the optical adhesive layer has high light transmittance, and the optical adhesive layer can be made of a polypropylene, but the present disclosure is not limited thereto.

Further, all of other structures and dispositions according to the embodiment of FIG. 5 are the same as the structures and the dispositions according to the embodiments of FIG. 1, and will not be described again herein.

Figure 6:
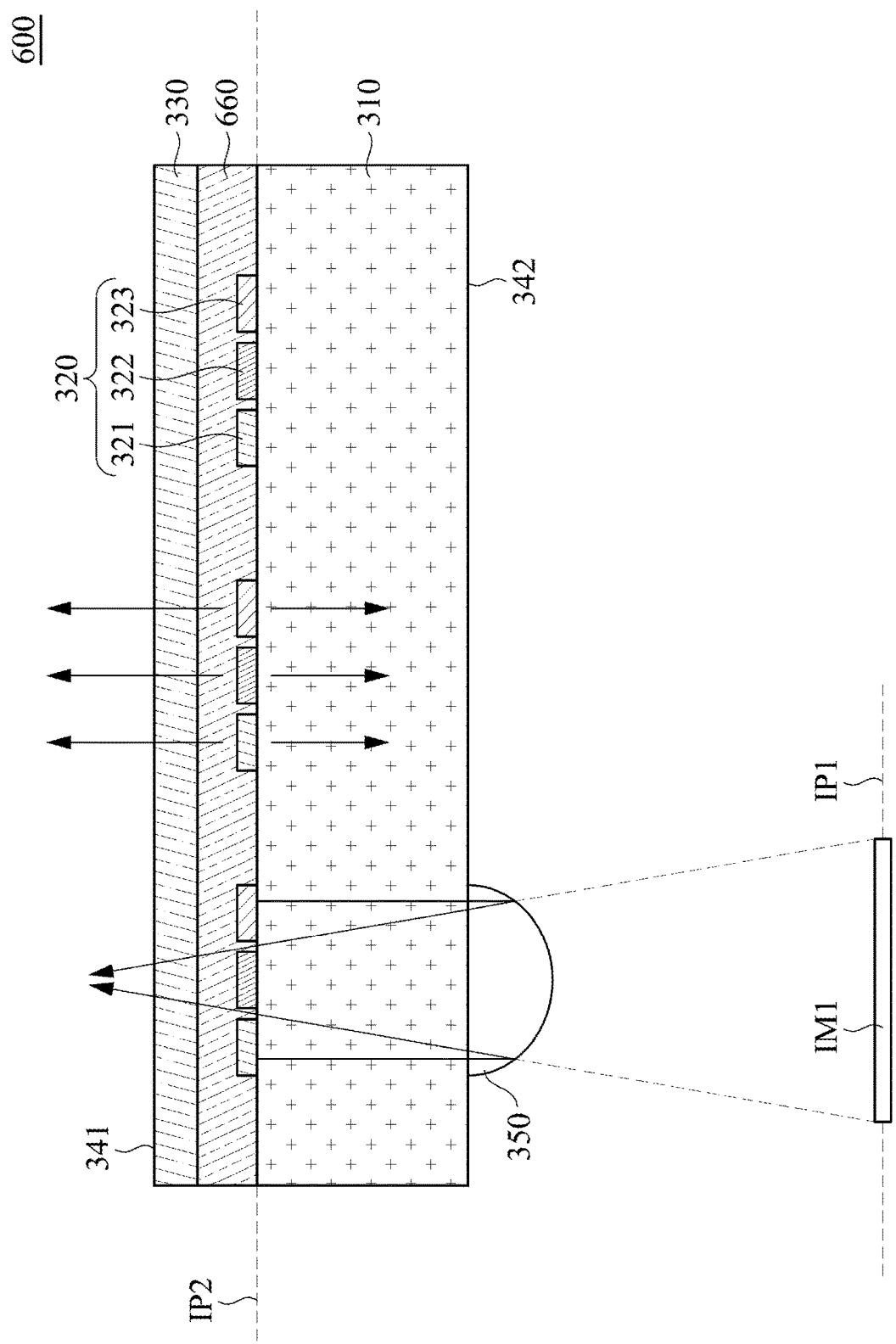
FIG. 6 is a schematic view of a micro LED transparent display according to another embodiment of the present disclosure.

FIG. 6 is a schematic view of a micro LED transparent display 600 according to another embodiment of the present disclosure. In FIG. 6, the micro LED transparent display 600 has a first display surface 341 and a second display surface 342, which are opposite to each other. The micro LED transparent display 600 includes a substrate 310, a plurality of pixels (its reference numeral is omitted), an encapsulation layer 660, and a grating layer 330, in which the substrate 310, the pixels, and the grating layer 330 are identical to those of the embodiment as shown in FIG. 3 and thus will not be described again herein.

Compared to the embodiment as shown in FIG. 3, the micro LED transparent display 600 of the present embodiment further includes a micro lens layer 350. The micro lens layer 350 is located at the side of the pixels adjacent to the second display surface 342. For example, as shown in FIG. 6, the micro lens layer 350 is located on the second display surface 342. Lights generated from the micro LEDs 321, 322, 323 of a first group of the pixels (e.g., the left pixel in FIG. 6) form a first image IM1 on a first imaging plane IP1 after propagating via the micro lens layer 350, and lights generated from the micro LEDs 321, 322, 323 of a second group of the pixels (e.g., the right and middle pixels in FIG. 6) partially penetrate through the first display surface 341 and partially penetrate through the second display surface 342 and form a second image on a second imaging plane IP2.

Specifically, the micro lens layer 350 includes a plurality of reflective lenses (only one is shown in FIG. 6). The reflective lenses are configured to reflect the lights of the first group of the pixels from the side of the pixels adjacent to the second display surface 342 toward the side of the pixels adjacent to the first display surface 341. That is, the first image IM1 is a virtual image and is able to be seen from the first display surface 341 only. The lights generated from the micro LEDs 321, 322, 323 of the second group of the pixels directly form the second image, so the micro LEDs 321, 322, 323 of the second group of the pixels are right on the second imaging plane IP2. The second image is able to be seen from both of the first display surface 341 and the second display surface 342. In other words, the first imaging plane IP1 is spaced apart from the second imaging plane IP2.

In some embodiments, the reflective lenses of the micro lens layer 350 are concave lenses, but the present disclosure is not limited in this regard.

In some embodiments, a number of the pixels in the first group is smaller than a number of the pixels in the second group. In this way, the resolution of the first image IM1 is less than the resolution of the second image.

In some embodiments, the reflective lenses of the micro lens layer 350 respectively correspond to the pixels of the first group. For example, FIG. 6 shows one of the reflective lenses of the micro lens layer 350 corresponds to one of the pixels of the first group. However, the present disclosure is not limited in this regard.

Figure 7:
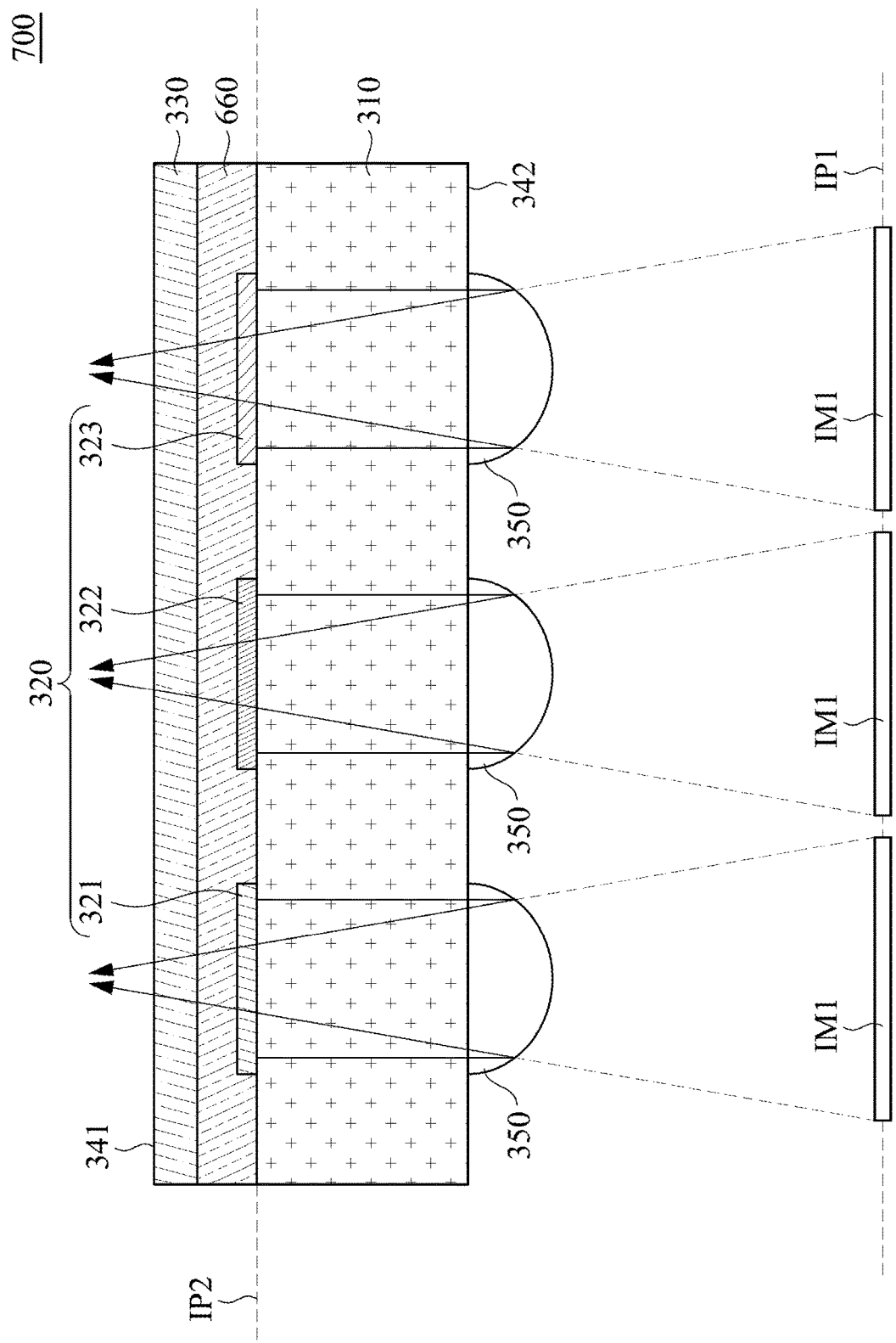
FIG. 7 is a schematic view of a micro LED transparent display according to another embodiment of the present disclosure.

FIG. 7 is a schematic view of a micro LED transparent display 700 according to another embodiment of the present disclosure. In FIG. 7, the micro LED transparent display 700 includes a substrate 310, a plurality of pixels (its reference numeral is omitted), a the micro lens layer 350, an encapsulation layer 660, and a grating layer 330, in which these components are identical to those of the embodiment as shown in FIG. 6 and thus will not be described again herein.

It should be pointed out that FIG. 7 only shows one of the pixels of the first group. Compared to the embodiment as shown in FIG. 6, the reflective lenses of the micro lens layer 350 of the present embodiment respectively correspond to the micro LEDs 321, 322, 323 of the first group of the pixels. In other words, each of the reflective lenses of the micro lens layer 350 corresponds to one sub-pixel of the first group of the pixels, and three sub-pixels (i.e., RGB) form the first image IM1.

In practical applications, the position of the micro lens layer 350 may be changed. For example, in some embodiments, the micro lens layer 350 may be disposed in the substrate 310 and in contact with the micro LEDs 321, 322, 323. In some embodiments, the reflective lenses of the micro lens layer 350 respectively corresponding to the micro LEDs 321, 322, 323 of one of the pixels may have different shapes and/or sizes. For example, the reflective lenses respectively corresponding to the micro LEDs 321, 323 of one pixel may be different from the reflective lens corresponding to the micro LED 322 of the one pixel in shape and/or size.

Figure 8:
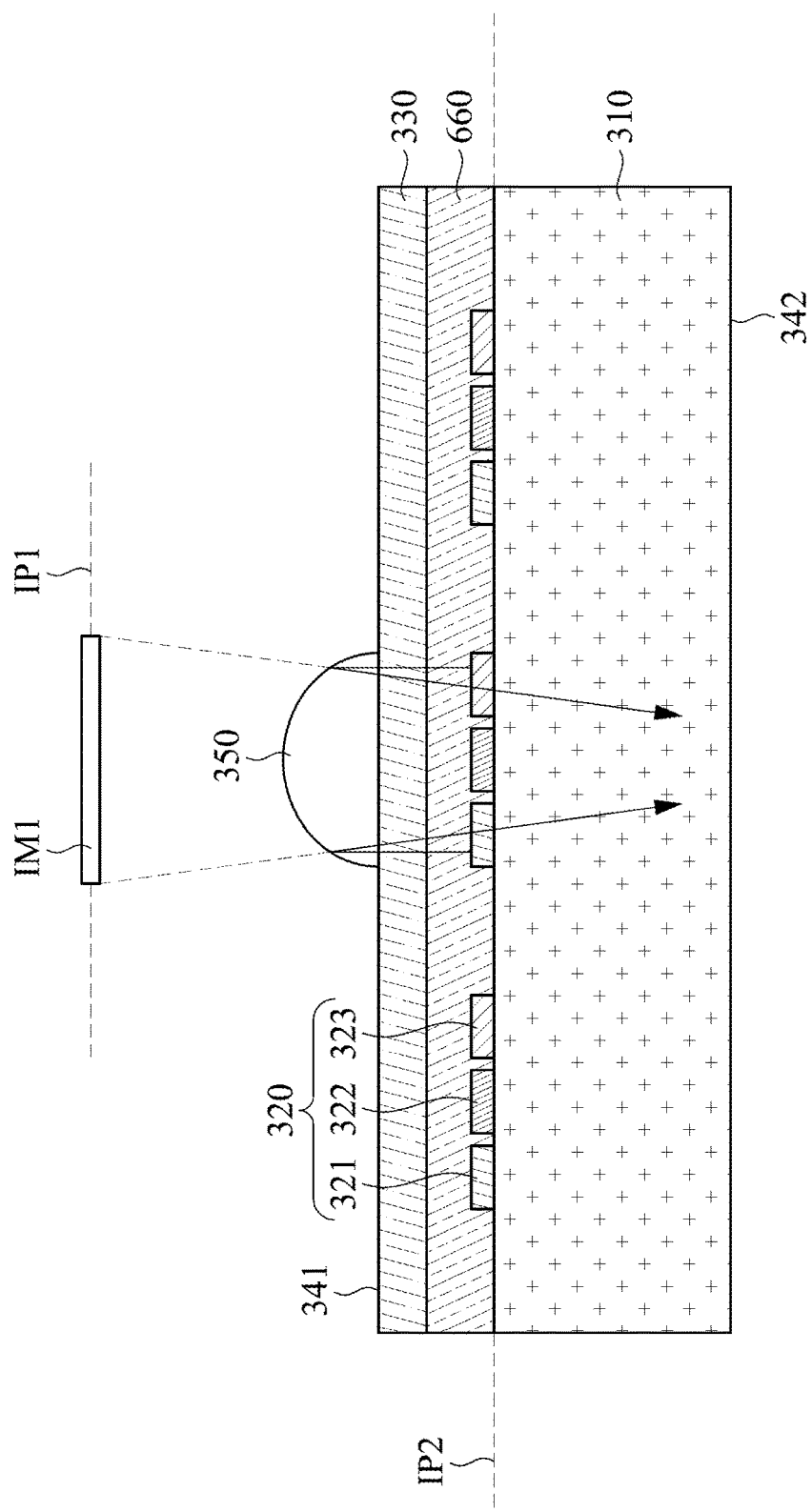
FIG. 8 is a schematic view of a micro LED transparent display according to another embodiment of the present disclosure.

FIG. 8 is a schematic view of a micro LED transparent display 800 according to another embodiment of the present disclosure. In FIG. 8, the micro LED transparent display 800 includes a substrate 310, a plurality of pixels (its reference numeral is omitted), a the micro lens layer 350, an encapsulation layer 660, and a grating layer 330, in which these components are identical to those of the embodiment as shown in FIG. 6 and thus will not be described again herein.

Compared to the embodiment as shown in FIG. 6, the micro lens layer 350 is located at the side of the pixels adjacent to the first display surface 341. For example, as shown in FIG. 8, the micro lens layer 350 is located on the first display surface 341. Lights generated from the micro LEDs 321, 322, 323 of a first group of the pixels (e.g., the middle pixel in FIG. 8) form a first image IM1 on a first imaging plane IP1 after propagating via the micro lens layer 350.

Specifically, the micro lens layer 350 includes a plurality of reflective lenses (only one is shown in FIG. 8). The reflective lenses are configured to reflect the lights of the first group of the pixels from the side of the pixels adjacent to the first display surface 341 toward the side of the pixels adjacent to the second display surface 342. That is, the first image IM1 is a virtual image and is able to be seen from the second display surface 342 only.

Figure 9:
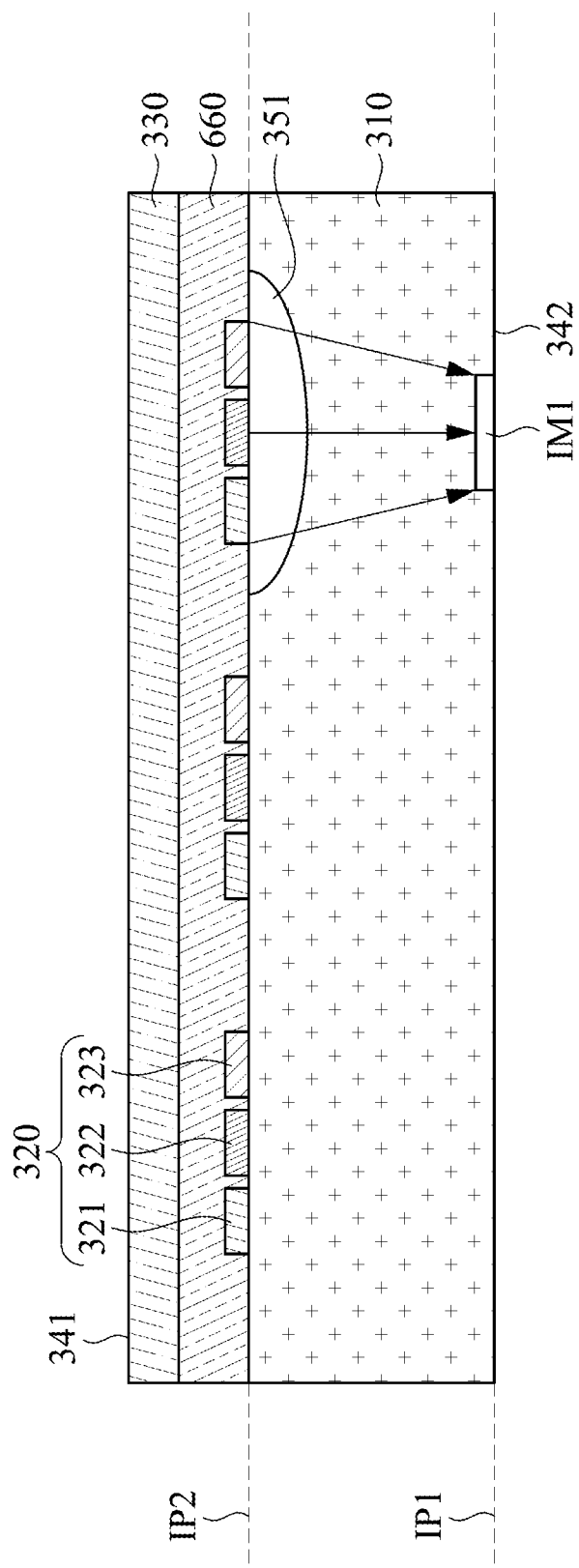
FIG. 9 is a schematic view of a micro LED transparent display according to another embodiment of the present disclosure.

FIG. 9 is a schematic view of a micro LED transparent display 900 according to another embodiment of the present disclosure. In FIG. 9, the micro LED transparent display 900 includes a substrate 310, a plurality of pixels (its reference numeral is omitted), an encapsulation layer 660, and a grating layer 330, in which the substrate 310, the pixels, and a grating layer 330 are identical to those of the embodiment as shown in FIG. 3 and thus will not be described again herein.

Compared to the embodiment as shown in FIG. 3, the micro LED transparent display 900 of the present embodiment further includes a micro transmissive lens layer 351. The micro transmissive lens layer 351 is located at the side of the pixels adjacent to the second display surface 342. For example, as shown in FIG. 9, the micro transmissive lens layer 351 is located in the substrate 310 and between the pixels and the second display surface 342. Lights generated from the micro LEDs 321, 322, 323 of a first group of the pixels (e.g., the right pixel in FIG. 9) form a first image IM1 on a first imaging plane IP1 after propagating via the micro transmissive lens layer 351, and lights generated from the micro LEDs 321, 322, 323 of a second group of the pixels (e.g., the left and middle pixels in FIG. 9) partially penetrate through the first display surface 341 and partially penetrate through the second display surface 342 and form a second image on a second imaging plane IP2.

Specifically, the micro transmissive lens layer 351 includes a plurality of transmissive lenses (only one is shown in FIG. 9). The transmissive lenses are configured to transmit the lights of the first group of the pixels. The first imaging plane IP1 coincides with the second display surface 342. That is, the first image IM1 is a real image and is able to be seen from both of the first display surface 341 and the second display surface 342. The lights generated from the micro LEDs 321, 322, 323 of the second group of the pixels directly form the second image, so the micro LEDs 321, 322, 323 of the second group of the pixels are right on the second imaging plane IP2. The second image is able to be seen from both of the first display surface 341 and the second display surface 342. In other words, the first imaging plane IP1 is spaced apart from the second imaging plane IP2.

In some embodiments, the transmissive lenses of the micro transmissive lens layer 351 are focusing lenses, but the present disclosure is not limited in this regard.

In some embodiments, a number of the pixels in the first group is smaller than a number of the pixels in the second group. In this way, the resolution of the first image IM1 is less than the resolution of the second image.

Figure 10:
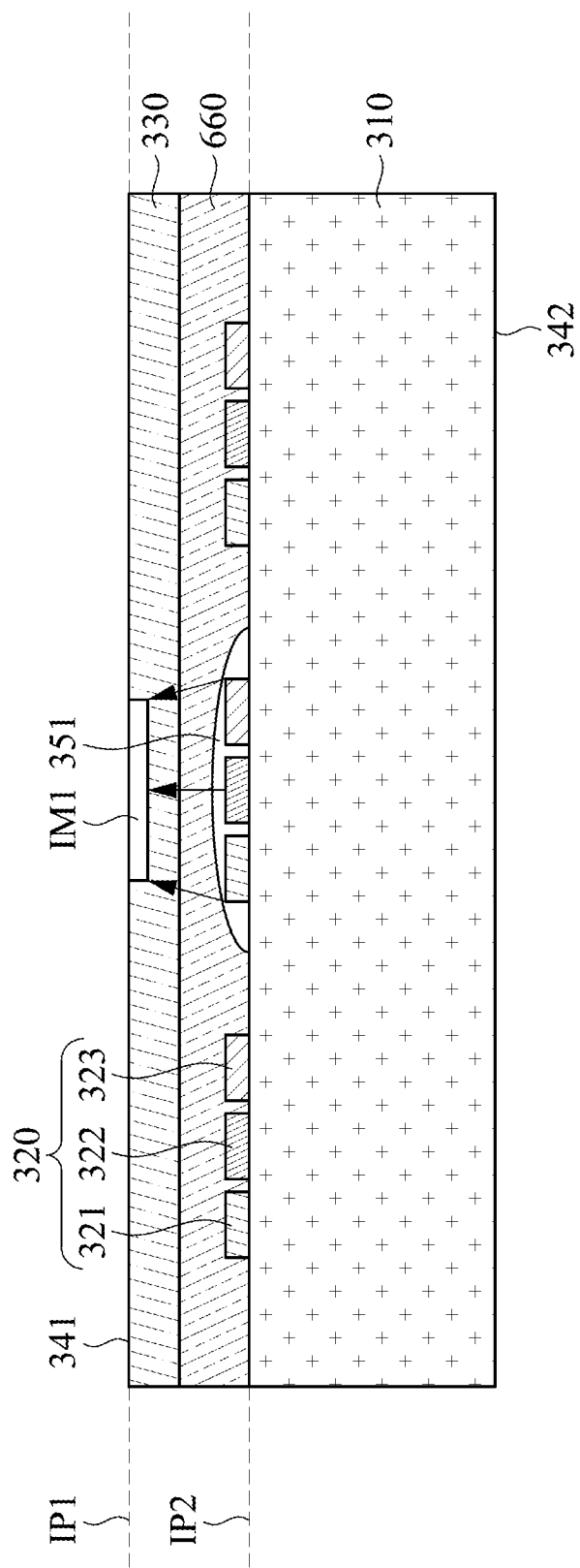
FIG. 10 is a schematic view of a micro LED transparent display according to another embodiment of the present disclosure.

In some embodiments, the transmissive lenses of the micro transmissive lens layer 351 respectively correspond to the pixels of the first group. For example, FIG. 10 shows one of the transmissive lenses of the micro transmissive lens layer 351 corresponds to one of the pixels of the first group. However, the present disclosure is not limited in this regard. In some other embodiments, the transmissive lenses of the micro transmissive lens layer 351 may respectively correspond to the micro LEDs 321, 322, 323 of the first group of the pixels.

FIG. 10 is a schematic view of a micro LED transparent display 1000 according to another embodiment of the present disclosure. In FIG. 10, the micro LED transparent display 1000 includes a substrate 310, a plurality of pixels (its reference numeral is omitted), a micro transmissive lens layer 351, an encapsulation layer 660, and a grating layer 330, in which these components are identical to those of the embodiment as shown in FIG. 9 and thus will not be described again herein.

Compared to the embodiment as shown in FIG. 9, the micro transmissive lens layer 351 is located at the side of the pixels adjacent to the first display surface 341. For example, as shown in FIG. 10, the micro transmissive lens layer 351 is located in the encapsulation layer 660 and between the substrate 310 and the first display surface 341. Lights generated from the micro LEDs 321, 322, 323 of a first group of the pixels (e.g., the middle pixel in FIG. 10) form a first image IM1 on a first imaging plane IP1 after propagating via the micro transmissive lens layer 351.

Specifically, the micro transmissive lens layer 351 includes a plurality of transmissive lenses (only one is shown in FIG. 10). The transmissive lenses are configured to transmit the lights of the first group of the pixels. The first imaging plane IP1 coincides with the first display surface 341. That is, the first image IM1 is a real image and is able to be seen from both of the first display surface 341 and the second display surface 342.

Figure 11:
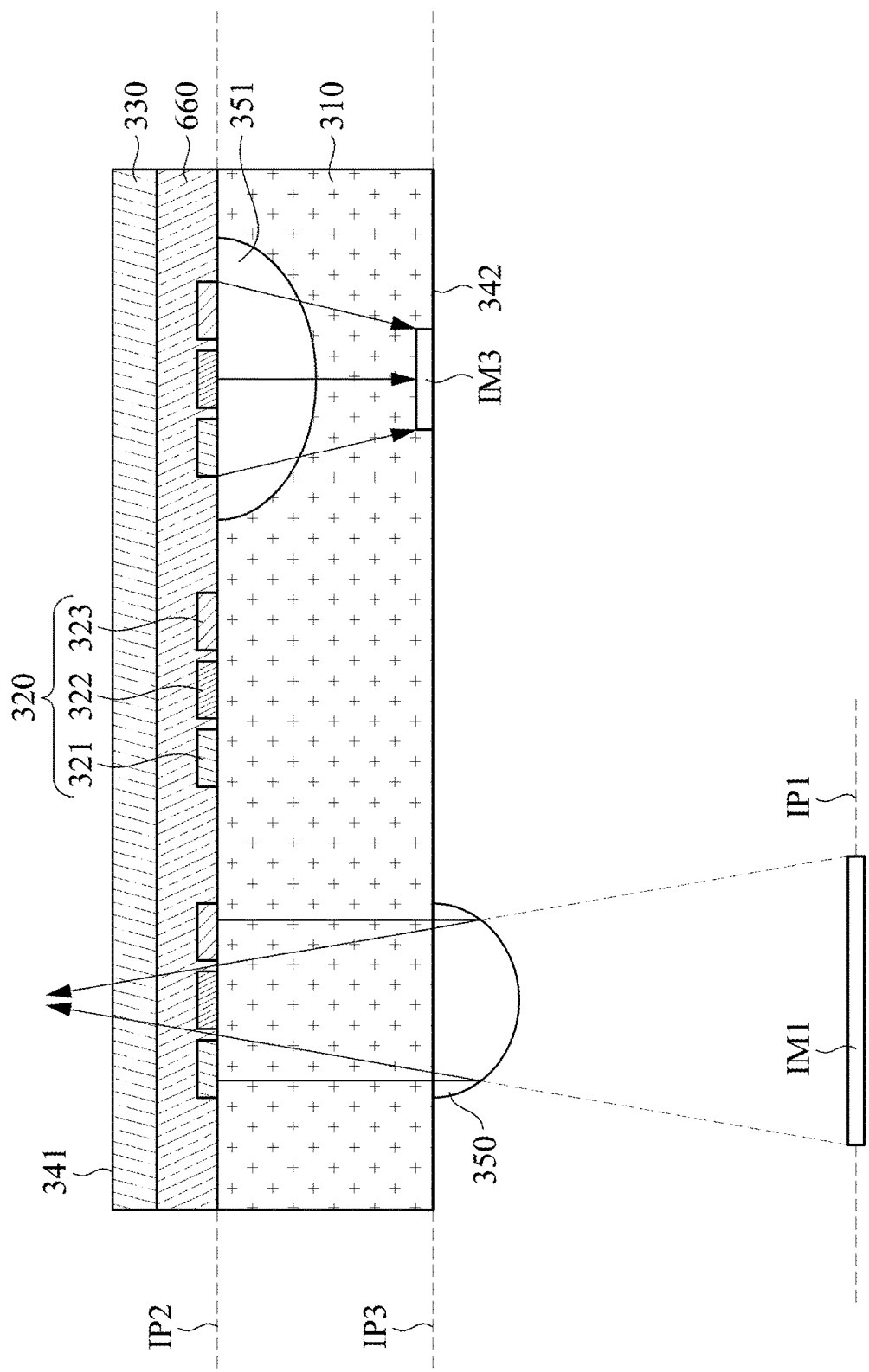
FIG. 11 is a schematic view of a micro LED transparent display according to another embodiment of the present disclosure.

FIG. 11 is a schematic view of a micro LED transparent display 1100 according to another embodiment of the present disclosure. In FIG. 11, the micro LED transparent display 1100 includes a substrate 310, a plurality of pixels (its reference numeral is omitted), a micro lens layer 350, an encapsulation layer 660, and a grating layer 330, in which these components are identical to those of the embodiment as shown in FIG. 6 and thus will not be described again herein.

Compared to the embodiment as shown in FIG. 6, the micro LED transparent display 1100 of the present embodiment further includes a micro transmissive lens layer 351. The micro transmissive lens layer 351 is located at the side of the pixels adjacent to the second display surface 342. For example, as shown in FIG. 11, the micro transmissive lens layer 351 is located in the substrate 310 and between the pixels and the second display surface 342. Lights generated from the micro LEDs 321, 322, 323 of a first group of the pixels (e.g., the left pixel in FIG. 11) form a first image IM1 on a first imaging plane IP1 after propagating via the micro lens layer 350. Lights generated from the micro LEDs 321, 322, 323 of a second group of the pixels (e.g., the middle pixel in FIG. 11) partially penetrate through the first display surface 341 and partially penetrate through the second display surface 342 and form a second image on a second imaging plane IP2. Lights generated from the micro LEDs of a third group of the pixels form a third image IM3 on a third imaging plane IP3 after propagating via the micro transmissive lens layer 351.

Specifically, the micro transmissive lens layer 351 includes a plurality of transmissive lenses (only one is shown in FIG. 11). The transmissive lenses are configured to transmit the lights of the third group of the pixels. The third imaging plane IP3 coincides with the second display surface 342. That is, the third image IM3 is a real image and is able to be seen from both of the first display surface 341 and the second display surface 342. In other words, the first imaging plane IP1, the second imaging plane IP2, and the third imaging plane IP3 are spaced apart from each other.

In some embodiments, the transmissive lenses of the micro transmissive lens layer 351 are focusing lenses, but the present disclosure is not limited in this regard.

In some embodiments, a number of the pixels in the third group is smaller than a number of the pixels in the second group. In this way, the resolution of the third image IM3 is less than the resolution of the second image.

In some embodiments, the transmissive lenses of the micro transmissive lens layer 351 respectively correspond to the pixels of the first group. For example, FIG. 11 shows one of the transmissive lenses of the micro transmissive lens layer 351 corresponds to one of the pixels of the third group. However, the present disclosure is not limited in this regard. In some other embodiments, the transmissive lenses of the micro transmissive lens layer 351 may respectively correspond to the micro LEDs 321, 322, 323 of the third group of the pixels.

In some other embodiments, the micro transmissive lens layer 351 may be located at the side of the pixels adjacent to the first display surface 341. For example, the micro transmissive lens layer 351 may be located in the encapsulation layer 660 and between the substrate 310 and the first display surface 341.

Figure 12:
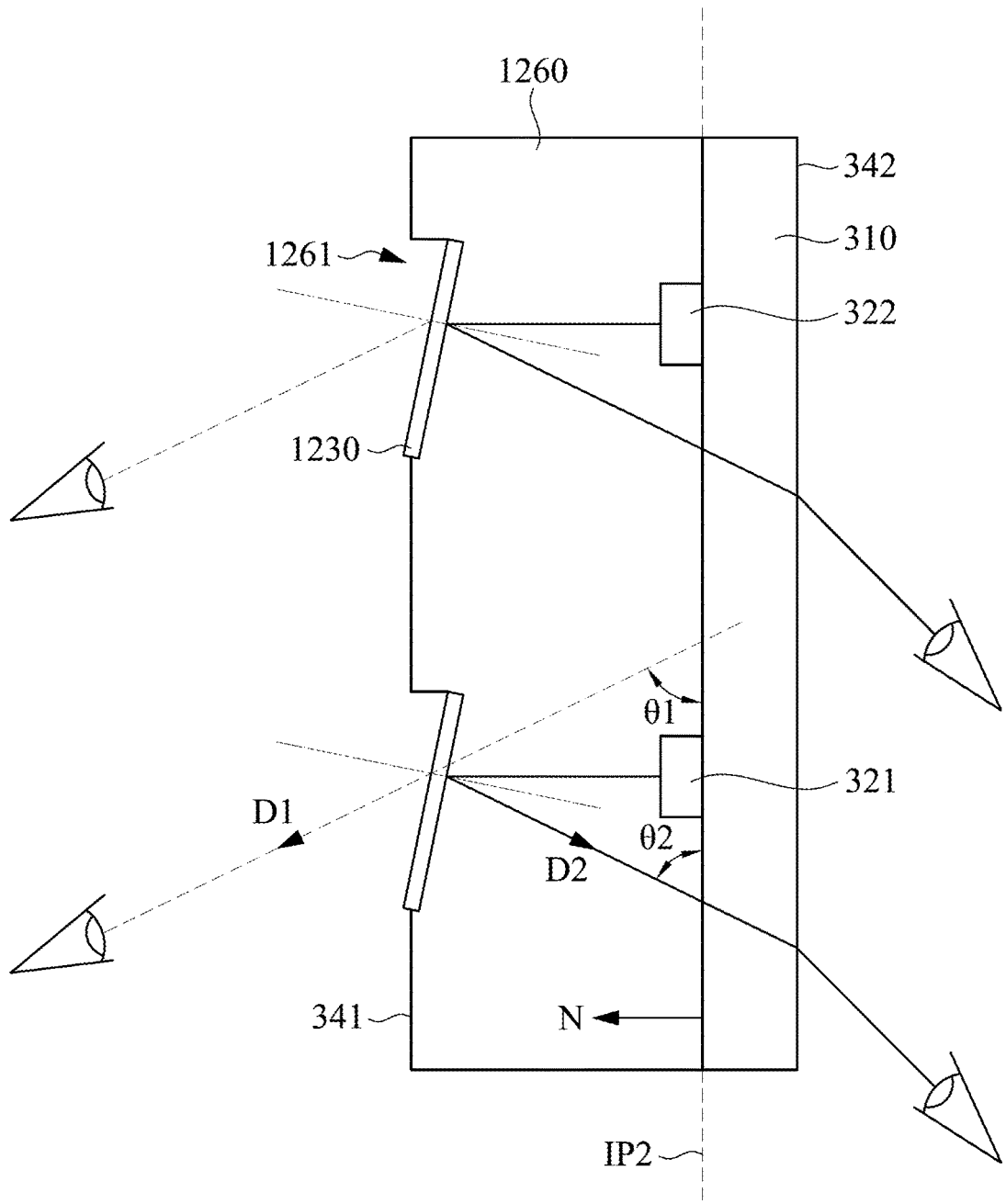
FIG. 12 is a schematic view of a micro LED transparent display according to another embodiment of the present disclosure.

FIG. 12 is a schematic view of a micro LED transparent display 1200 according to another embodiment of the present disclosure. In FIG. 12, the micro LED transparent display 1200 includes a substrate 310, a plurality of pixels (only two of the micro LEDs 321, 322, 323 thereof are shown), a micro lens layer 350 (which is omitted in FIG. 12 and can be referred to FIG. 6), an encapsulation layer 1260, and a grating layer 1230, in which the substrate 310, the pixels, and the micro lens layer 350 are identical to those of the embodiment as shown in FIG. 6 and thus will not be described again herein.

Compared to the embodiment as shown in FIG. 6, the micro LED transparent display 1200 of the present embodiment replaces the encapsulation layer 660 shown in FIG. 6 with the encapsulation layer 1260. The encapsulation layer 1260 is located between the substrate 310 and the grating layer 1230 and covers the micro LEDs 321, 322, 323. In addition, the grating layer 1230 is disposed on the substrate 310. The pixels are located between the grating layer 1230 and the substrate 310. The lights generated from the micro LEDs 321, 322, 323 are controlled by the grating layer 1230 to partially penetrate through the first display surface 341 and to be partially reflected to penetrate through the second display surface 342.

Specifically, as shown in FIG. 12, the grating layer 1230 includes a plurality of grating segments aligned with the micro LEDs 321, 322, 323 respectively in a normal direction N of the second imaging plane IP2. Each of the grating segments has a surface facing and inclined to the second imaging plane IP2. In detail, the encapsulation layer 1260 has a plurality of recesses 1261, and the grating segments are respectively disposed in the recesses 1261.

In some embodiments, the lights transmitting through the grating layer 1230 propagate in a first direction D1. The lights reflected by the grating layer 1230 propagate in a second direction D2. An angle 61 between the second imaging plane IP2 and the first direction D1 is equal to an angle 62 between the second imaging plane IP2 and the second direction D2. In this way, when the micro LED transparent display 1200 is hung high and the first display surface 341 and the second display surface 342 are arranged laterally, people who are located below the micro LED transparent display 1200 and on both sides can watch the images of the micro LED transparent display 1200 from substantially the same angle of view.

In summary, both of the transparency and the luminance of the micro LED transparent display can be maintained, and the size or the thickness of the micro LED transparent display can be reduced. Moreover, the control of the light direction (that is, a display image can be shown from a front side, a back side or both of the front side and the back side) can be obtained. Further, the micro LED transparent display of the present disclosure can be applied to the outdoor billboards and the exhibition windows, even can be applied to the windows of the cars, but the applications of the present disclosure are not limited thereto. Therefore, the dual-side display, the transparency and the effect of lowering the cost of the panel of the micro LED transparent display can be achieved.

The foregoing description, for purpose of explanation, has been described with reference to specific examples. It is to be noted that Tables show different data of the different examples; however, the data of the different examples are obtained from experiments. The examples were chosen and described in order to best explain the principles of the disclosure and its practical applications, to thereby enable others skilled in the art to best utilize the disclosure and various examples with various modifications as are suited to the particular use contemplated. The examples depicted above and the appended drawings are exemplary and are not intended to be exhaustive or to limit the scope of the present disclosure to the precise forms disclosed. Many modifications and variations are possible in view of the above teachings.

What is claimed is:

1. A micro LED transparent display having a first display surface and a second display surface opposite to each other, the micro LED transparent display comprising:
    a substrate located between the first display surface and the second display surface;
    a plurality of pixels arranged in arrays on the substrate, each of the pixels comprising a plurality of micro LEDs, and the micro LEDs being electrically connected to the substrate; and
    a micro lens layer located at one side of the pixels,
    wherein lights generated from the micro LEDs of a first group of the pixels form a first image on a first imaging plane after propagating via the micro lens layer, and lights generated from the micro LEDs of a second group of the pixels partially penetrate through the first display surface and partially penetrate through the second display surface and form a second image on a second imaging plane.

2. The micro LED transparent display of claim 1, wherein the first image is able to be seen from one of the first display surface and the second display surface only, and the second image is able to be seen from both of the first display surface and the second display surface.

3. The micro LED transparent display of claim 2, wherein the micro lens layer comprises a plurality of reflective lenses, and the reflective lenses respectively correspond to the pixels of the first group.

4. The micro LED transparent display of claim 2, wherein the micro lens layer comprises a plurality of reflective lenses, and the reflective lenses respectively correspond to the micro LEDs of the first group of the pixels.

5. The micro LED transparent display of claim 2, wherein the micro lens layer comprises a plurality of reflective lenses configured to reflect the lights of the first group of the pixels toward another of the first display surface and the second display surface.

6. The micro LED transparent display of claim 2, further comprising:
    a micro transmissive lens layer located between the pixels and one of the first display surface and the second display surface,
    wherein lights generated from the micro LEDs of a third group of the pixels form a third image on a third imaging plane after propagating via the micro transmissive lens layer.

7. The micro LED transparent display of claim 6, wherein the micro transmissive lens layer comprises a plurality of transmissive lenses configured to transmit the lights of the third group of the pixels.

8. The micro LED transparent display of claim 7, wherein the third imaging plane coincides with one of the first display surface and the second display surface adjacent to the micro transmissive lens layer.

9. The micro LED transparent display of claim 6, wherein a number of the pixels in the third group is smaller than a number of the pixels in the second group.

10. The micro LED transparent display of claim 1, wherein the first image is a virtual image and the first imaging plane is spaced apart from the second imaging plane.

11. The micro LED transparent display of claim 1, wherein the micro lens layer comprises a plurality of transmissive lenses configured to transmit the lights of the first group of the pixels.

12. The micro LED transparent display of claim 11, wherein the first imaging plane coincides with one of the first display surface and the second display surface adjacent to the micro lens layer.

13. The micro LED transparent display of claim 1, wherein a number of the pixels in the first group is smaller than a number of the pixels in the second group.

14. The micro LED transparent display of claim 1, further comprising:
    a grating layer disposed on the substrate, the pixels being located between the grating layer and the substrate,
    wherein the lights generated from the micro LEDs are controlled by the grating layer to partially penetrate through one of the first display surface and the second display surface and to be partially reflected to penetrate through another of the first display surface and the second display surface.

15. The micro LED transparent display of claim 14, wherein the grating layer comprises a plurality of grating segments aligned with the micro LEDs respectively in a normal direction of the second imaging plane.

16. The micro LED transparent display of claim 15, wherein each of the grating segments has a surface facing and inclined to the second imaging plane.

17. The micro LED transparent display of claim 15, further comprising:
   an encapsulation layer located between the substrate and the grating layer and covering the micro LEDs,
   wherein the encapsulation layer has a plurality of recesses, and the grating segments are respectively disposed in the recesses.

18. The micro LED transparent display of claim 15, wherein the lights transmitting through the grating layer propagate in a first direction, the lights reflected by the grating layer propagate in a second direction, and an angle between the second imaging plane and the first direction is equal to an angle between the second imaging plane and the second direction.

* * * * *